(12) United States Patent
Chow (10) Patent No.: US 11,128,292 B2
(45) Date of Patent: Sep. 21, 2021

(54) SOFT-START CONTROL CIRCUIT

(71) Applicant: Chicony Power Technology Co., Ltd., New Taipei (TW)

(72) Inventor: Wing Kai Chow, New Taipei (TW)

(73) Assignee: Chicony Power Technology Co., Ltd., New Taipei (TW)

( * ) Notice: Subject to any disclaimer, the term of this patent is extended or adjusted under 35 U.S.C. 154(b) by 0 days.

(21) Appl. No.: 16/999,054

(22) Filed: Aug. 20, 2020

(65) Prior Publication Data

US 2020/0382115 A1 Dec. 3, 2020

Related U.S. Application Data

(63) Continuation-in-part of application No. 16/593,961, filed on Oct. 4, 2019, now abandoned.

(30) Foreign Application Priority Data

May 31, 2019 (CN) .......................... 201910468057.7

(51) Int. Cl.
*H03K 17/16* (2006.01)
*H03K 17/0812* (2006.01)

(52) U.S. Cl.
CPC ..... *H03K 17/163* (2013.01); *H03K 17/08122* (2013.01)

(58) Field of Classification Search
None
See application file for complete search history.

(56) References Cited

U.S. PATENT DOCUMENTS

| | | | | |
|---|---|---|---|---|
| 4,445,055 A | * | 4/1984 | Bete | H02M 3/155 323/351 |
| 4,500,801 A | * | 2/1985 | Janutka | H03K 17/04123 327/377 |
| 4,877,982 A | * | 10/1989 | Walker | H02M 3/155 327/432 |

(Continued)

FOREIGN PATENT DOCUMENTS

| | | |
|---|---|---|
| CN | 103795280 | 5/2014 |
| CN | 104795976 | 7/2015 |

(Continued)

OTHER PUBLICATIONS

"Office Action of China Counterpart Application", dated May 7, 2021, p. 1-p. 9.

*Primary Examiner* — Jeffery S Zweizig
(74) *Attorney, Agent, or Firm* — JCIPRNET (57) ABSTRACT

A soft-start control circuit is provided. The soft-start control circuit includes a load switch, a driving unit and a filtering unit. The first terminal of the load switch is configured to receive an input voltage. The control terminal of the load switch is configured to receive a switching signal and perform switching between on and off according to the switching signal, thereby performing a soft-start operation. The second terminal of the load switch is configured to provide a switched voltage. The driving unit is configured to provide a switching signal according to a control signal and release a parasitic charge stored in the load switch when the load switch is turned off. The filtering unit is configured to convert the switched voltage into an output voltage.

17 Claims, 5 Drawing Sheets

(56) References Cited

U.S. PATENT DOCUMENTS

| | | | | |
|---|---|---|---|---|
| 6,320,449 | B1 * | 11/2001 | Capici | H03K 17/04123 |
| | | | | 323/284 |
| 6,804,096 | B2 * | 10/2004 | Nagata | H03K 17/0822 |
| | | | | 361/78 |
| 6,984,968 | B2 * | 1/2006 | Moon | H02M 3/156 |
| | | | | 323/282 |
| 7,893,676 | B2 * | 2/2011 | Hanna | H03K 17/6874 |
| | | | | 323/284 |
| 8,264,807 | B2 * | 9/2012 | Hong | H03K 17/22 |
| | | | | 361/91.5 |
| 8,860,471 | B2 * | 10/2014 | Xu | H02M 1/08 |
| | | | | 327/109 |

FOREIGN PATENT DOCUMENTS

| | | |
|---|---|---|
| CN | 104933987 | 9/2015 |
| CN | 107394770 | 11/2017 |

\* cited by examiner

SOFT-START CONTROL CIRCUIT

CROSS-REFERENCE TO RELATED APPLICATION

This application is a continuation-in-part application of and claims the priority benefit of U.S. application Ser. No. 16/593,961, filed on Oct. 4, 2019, now pending, which claims the priority benefit of China application serial no. 201910468057.7, filed on May 31, 2019. The entirety of each of the above-mentioned patent applications is hereby incorporated by reference herein and made a part of this specification.

BACKGROUND OF THE INVENTION

Field of the Invention

The invention relates to a soft-start control circuit, and particularly relates to a soft-start control circuit which reduces power consumption during a soft-start operation.

Description of Related Art

In general, a load switch is disposed between a power output terminal and the next circuit. The load switch is capable of performing a soft-start operation to prevent an inrush current from occurring at the load switch.

However, the conventional load switch is operated in a linear mode during the time when the soft-start operation is performed. In the linear mode, the load switch is not completely turned on or completely turned off. Therefore, the power consumption at the load switch is significant. Consequently, the load switch may be subjected to a high thermos-electrical stress during the time when the soft-start operation is performed. When the thermos-electrical stress exceeds the limit which the load switch can endure, hot spots may be present in the structure of the load switch, and the load switch may failure during the time of the soft-start operation. Therefore, the power consumption of the load switch at the time when the soft-start operation needs to be reduced.

SUMMARY OF THE INVENTION

The invention provides a soft-start control circuit which reduces power consumption in a soft-start operation.

According to an embodiment of the invention, a soft-start control circuit includes a load switch, a driving unit, and a filtering unit. The load switch has a first terminal, a second terminal, and a control terminal. The first terminal of the load switch is configured to receive an input voltage. The control terminal of the load switch is configured to receive a switching signal and perform switching between on and off according to the switching signal, thereby performing a soft-start operation. The second terminal of the load switch is configured to provide a switched voltage. The driving unit is coupled to the first terminal of the load switch and the control terminal of the load switch. The driving unit includes a driving switch and a discharging circuit. The driving switch is configured to provide the switching signal according to a control signal. The discharging circuit is coupled to the load switch and the driving switch. The discharging circuit is configured to release a parasitic charge stored in the load switch when the load switch is turned off. The filtering unit is coupled to the second terminal of the load switch. The filtering unit is configured to convert the switched voltage into an output voltage.

Based on the statement above, the soft-start control circuit releases the parasitic charge stored in the load switch when the load switch is turned off. In this way, the load switch is capable of rapidly switching between on and off during the soft-start operation, thereby reducing the power consumption of the load switch.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Descriptions of the invention are given with reference to the exemplary embodiments illustrated with accompanied drawings, wherein same or similar parts are denoted with same reference numerals. Wherever possible, same reference numerals are used in the drawings and the description to refer to same or similar parts.

Figure 1:
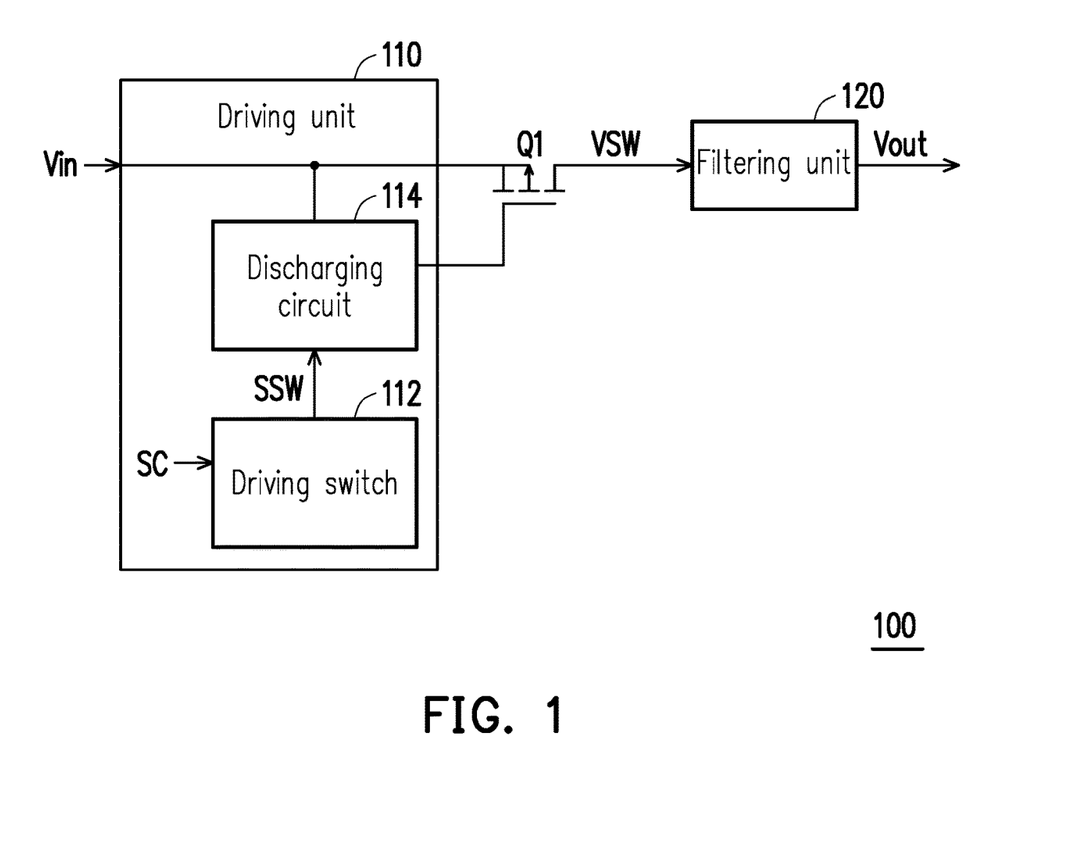
FIG. 1 is a schematic diagram illustrating a soft-start control circuit in accordance with a first embodiment of the invention.

Referring to FIG. 1, FIG. 1 is a schematic diagram illustrating a soft-start control circuit in accordance with a first embodiment of the invention. In the embodiment, a soft-start control circuit 100 includes a load switch Q1, a driving unit 110, and a filtering unit 120. The load switch Q1 may be realized as a switch in the form of a transistor. The load switch Q1 of the embodiment is realized as a P-type MOS field-effect transistor. The first terminal of the load switch Q1 is configured to receive an input voltage Vin. The control terminal of the load switch Q1 is configured to receive a switching signal SSW. The second terminal of the load switch Q1 is configured to provide a switched voltage VSW. The load switch Q1 may perform switching between on and off according to the switching signal SSW, thereby performing a soft-start operation. The switched voltage VSW is a voltage signal generated by converting the input voltage Vin according to the switching signal SSW by the load switch Q1. Therefore, the waveform of switched voltage VSW is according to the duty cycle of control signal during soft-start time.

In the embodiment, the driving unit 110 is coupled to the first terminal of the load switch Q1 and the control terminal of the load switch Q1. The driving unit 110 includes a driving switch 112 and a discharging circuit 114. The driving switch 112 is configured to provide the switching signal SSW according to a control signal SC. The load switch Q1 of the embodiment may be realized as a switch in the form of a transistor. The discharging circuit 114 is coupled to the load switch Q1 and the driving switch 112. When the load switch Q1 is turned off, the discharging circuit 114 is configured to release a parasitic charge stored in the load switch Q1. More specifically, the discharging circuit 114 may provide a discharging path connected between the first terminal of the load switch Q1 and the control terminal of the load switch Q1 at the time when the load switch Q1 is turned off, so as to release the parasitic charge stored between the first terminal and the control terminal of the load switch Q1.

In the embodiment, the filtering unit 120 is coupled to the second terminal of the load switch Q1. The filtering unit 120 is configured to convert the switched voltage VSW into an output voltage Vout according to the duty cycle of the switched voltage VSW. For example, if the duty cycle of the switched voltage VSW becomes greater, the voltage value of the output voltage Vout will become higher. In addition, the filtering unit 120 may also filter out a ripple voltage of the switched voltage VSW.

It should be noted that, during the soft-start operation, the soft-start control circuit 100 releases the parasitic charge stored in the load switch Q1 through the discharging circuit 114 when the load switch Q1 is turned off. Therefore, the load switch Q1 is capable of rapidly switching between on and off during the soft-start operation, thereby reducing the power consumption of the load switch Q1. In this way, the load switch Q1 does not generate high thermos-electrical stress, thereby preventing the load switch Q1 failure during the soft-start operation.

Figure 2:
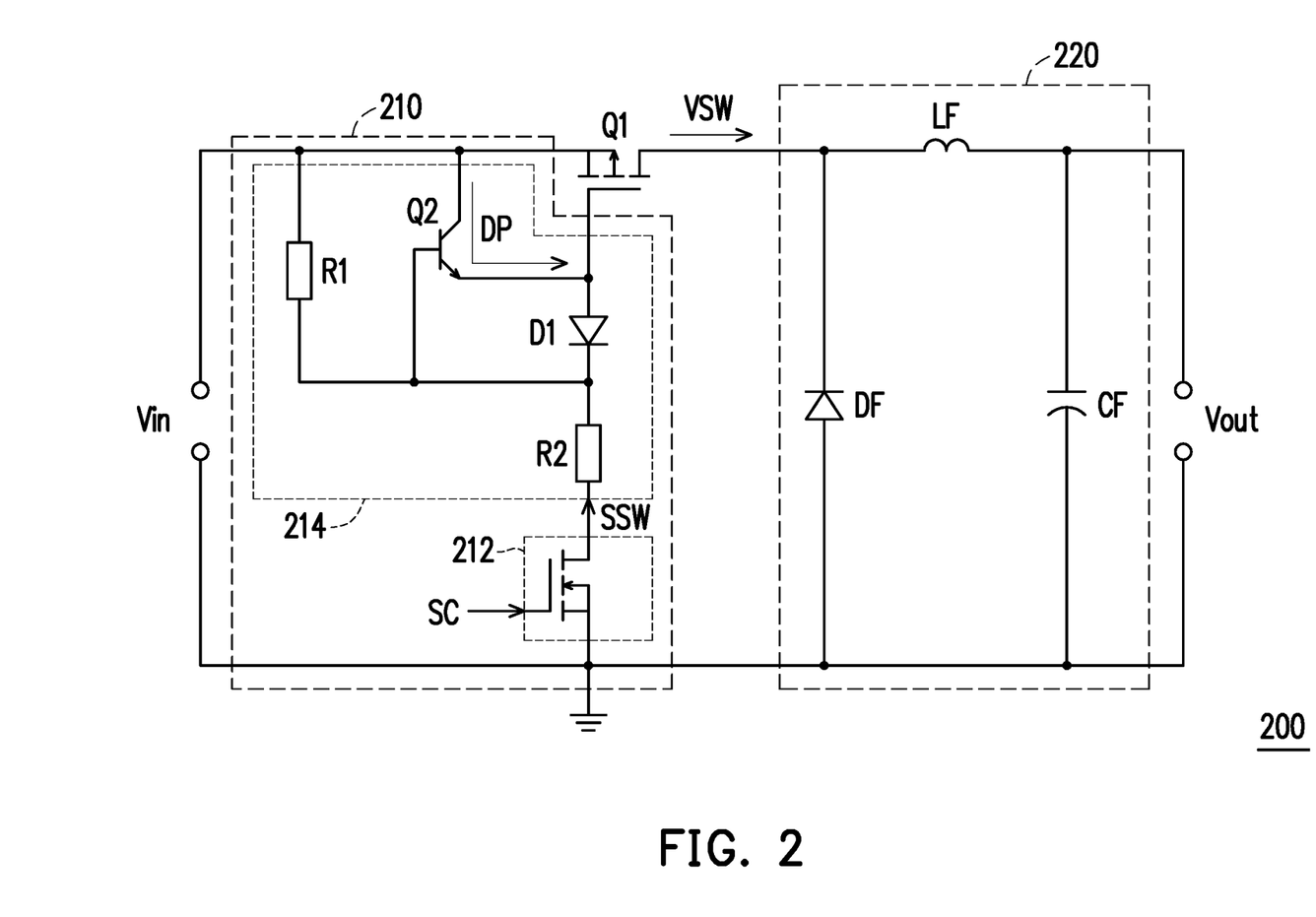
FIG. 2 is a schematic diagram illustrating a soft-start control circuit in accordance with a second embodiment of the invention.

Referring to FIG. 2, FIG. 2 is a schematic diagram illustrating a soft-start control circuit in accordance with a second embodiment of the invention. In the embodiment, a soft-start control circuit 200 includes a load switch Q1, a driving unit 210, and a filtering unit 220. The driving unit 210 includes a driving switch 212 and a discharging circuit 214. The driving switch 212 is realized as an N-type field-effect transistor or NPN bipolar transistor. The discharging circuit 214 includes a bipolar transistor Q2. The bipolar transistor Q2 is realized as an NPN bipolar transistor. The bipolar transistor Q2 includes a collector, an emitter, and a base. The collector of the bipolar transistor Q2 is coupled to the first terminal of the load switch Q1. The emitter of the bipolar transistor Q2 is coupled to the control terminal of the load switch Q1. In the embodiment, once the bipolar transistor Q2 is turned on, the bipolar transistor Q2 may form a discharging path DP connected between the first terminal and the control terminal of the load switch Q1.

More specifically, the discharging circuit 214 further includes a first resistor R1 and a second resistor R2. The first terminal of the first resistor R1 is coupled to the collector of the bipolar transistor Q2. The second terminal of the first resistor R1 is coupled to the base of the bipolar transistor Q2. The first terminal of the second transistor R2 is coupled to the base of the bipolar transistor Q2 and the second terminal of the first transistor R1. The second terminal of the second resistor R2 is coupled to the driving switch 212. The first terminal of the driving switch 212 is coupled to the control terminal of the load switch Q1 through the second resistor R2. The second end of the driving switch 212 is coupled to a reference low potential (such as ground). The control terminal of the driving switch 212 is configured to receive the control signal SC. In the embodiment, the driving switch 212 is turned on according to the control signal SC at the high voltage level. At this time, the voltage level of the first terminal of the driving switch 212 is low, thereby providing a low voltage level switching signal SSW. The control terminal of the load switch Q1 receives the switching signal SSW through the second resistor R2, and the load switch Q1 is turned on according to the low voltage level switching signal SSW. The base of the bipolar transistor Q2 receives the switching signal SSW through the second resistor R2, and the bipolar transistor Q2 is turned off according to the low voltage level switching signal SSW. Therefore, when the driving switch 212 is turned on and the load switch Q1 is turned on, the bipolar transistor Q2 is turned off. In the embodiment, the discharging circuit 214 also includes a diode D1. The anode of the diode D1 is coupled to the emitter of the bipolar transistor Q2 and the control terminal of the load switch Q1. The cathode of the diode D1 is coupled to the base of the bipolar transistor Q2. The forward volt drop of diode D1 will form a reverse bias on the base-emitter junction of the bipolar transistor Q2 if the load switch Q1 is turned on. In this way, it ensures that the discharging path DP is not formed when the load switch Q1 is turned on.

On the other hand, the driving switch 212 is turned off according to the control signal SC at the low voltage level. At this time, the base of the bipolar transistor Q2 receives the parasitic charge of load switch Q1 through the first resistor R1, so that it forms a forward board on the base-emitter junction of the bipolar transistor Q2. Consequently, the bipolar transistor Q2 is turned on, so as to form the discharging path DP between the first terminal and the control terminal of the load switch Q1. After the discharging path DP is formed, a short circuit is substantially formed between the first terminal and the control terminal of the load switch Q1. Therefore, the parasitic charge stored between the first terminal and the control terminal of the load switch Q1 is released through the discharging path DP. The load switch Q1 is also rapidly turned off due to the short circuit between the first terminal and the control terminal of the load switch Q1. In other words, when the load switch Q1 is turned off, the bipolar transistor Q2 is turned on to form the discharging path DP.

In the embodiment, the filtering unit 220 includes a filtering inductor LF, a filtering capacitor CF, and a filtering diode DF. The first terminal of the filtering inductor LF is coupled to the second terminal of the load switch Q1 to receive the switched voltage VSW. The second terminal of the filtering inductor LF is configured to provide the output voltage Vout. The filtering capacitor CF is coupled between the second terminal of the filtering inductor LF and the reference low potential (such as ground). The cathode of the filtering diode DF is coupled to the first terminal of the filtering inductor LF. The anode of the filtering diode DF is coupled to the reference low potential.

In the embodiment, when the load switch Q1 is turned on, the switched voltage VSW is at the high voltage level, a positive potential difference is applied to between the first terminal and the second terminal of the filtering inductor LF, so the current flowing through the filtering inductor LF rises linearly. The current provides the output loading current at output voltage Vout and charges the filtering capacitor CF.

On the other hand, when the load switch Q1 is turned off, the switched voltage VSW is at the low voltage potential, which indicates that the filtering unit 220 is electrically insulated from the input voltage Vin. At this time, a negative potential difference is generated between the first terminal and the second terminal of the filtering inductor LF. The filtering inductor LF starts discharging. The discharging current flows from the second terminal of the filtering inductor LF, through the filtering capacitor CF and the filtering diode DF, and back to the first terminal of the filtering inductor LF. The filtering capacitor CF discharges to maintain the output voltage VOUT.

In the embodiment, a time during the switched voltage VSW at the high voltage level is increased, the voltage value of the output voltage Vout is also increased. When the switched voltage VSW is at the low voltage level, the voltage value of the output voltage Vout can still be maintained by the filtering unit 220. In this way, the filtering unit 220 may perform smoothing process on a waveform of the switched voltage VSW to generate the output voltage Vout.

Figure 3:
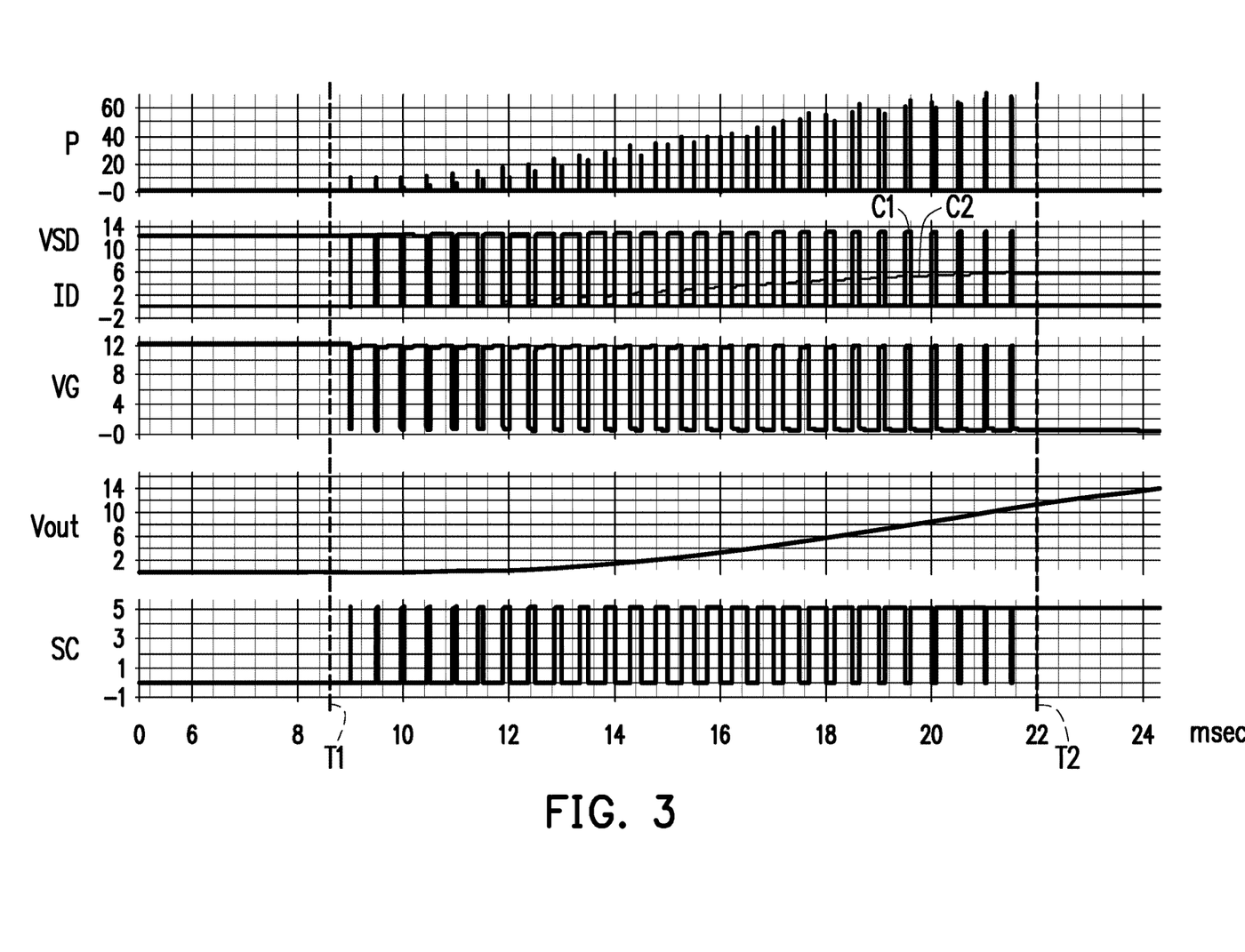
FIG. 3 is a diagram illustrating simulation results of a soft-start operation in accordance with an embodiment of the invention.

Referring to FIGS. 1 and 3, FIG. 3 is a diagram illustrating simulation results of a soft-start operation according to an embodiment of the invention. FIG. 3 shows the waveforms of the control signal SC of the soft-start operation, the output voltage Vout, the voltage signal VG at the control terminal of the load switch Q1, the potential difference VSD (curve C1) between the first terminal and the second terminal of the load switch Q1, the conducting current ID (curve C2) of the load switch Q1, and the dissipated power P of the load switch Q1. In FIG. 3, the horizontal axes of the respective waveforms indicate time. The unit of time is millisecond (msec). The vertical axis in the waveform for the dissipated power P of the load switch Q1 indicates power value. The unit of power values is watt. The vertical axis in the waveform for the conducting current ID of the load switch Q1 indicates current value. The unit of current values is ampere. The vertical axes in the waveforms for the control signal SC, the output voltage Vout, the voltage signal VG, and the potential difference VSD indicate voltage values. The unit of voltage values is volt.

In the embodiment, before the time T1, the control signal SC is at the low voltage level. In other words, the control signal SC is not provided yet. The driving switch 112 is turned off. At this time, the voltage signal VG at the control terminal of the load switch Q1 is maintained at the high voltage level. The load switch Q1 is turned off. Therefore, the potential difference VSD between the first terminal and the second terminal of the load switch Q1 is maintained at the high voltage level, and the conducting current ID of the load switch Q1 is 0.

After the time T1, the soft-start operation starts to perform, and the control signal SC start to provide PWM signal as well. The duty cycle of the PWM signal is gradually increased from low to high. The driving switch 112 is turned on during the control signal SC is at the high voltage level. The switching signal SSW at the low voltage level is provided. Therefore, the voltage signal VG of the control terminal of the load switch Q1 is at the low voltage level. The load switch Q1 is turned on. Accordingly, the state of the control signal SC and the voltage signal VG are opposite. Since the load switch Q1 is turned on, the potential difference VSD between the first terminal and the second terminal of the load switch Q1 is 0, and the conducting current ID of the load switch Q1 is generated. The output voltage Vout is also generated. At this time, the filtering unit 112 may provide the output voltage Vout according to the duty cycle of control signal SC.

On the other hand, during the time when the control signal SC is at the low voltage level, the driving switch 212 is turned off. The discharging circuit 114 may provide the discharging path connected between the first terminal and the control terminal of the load switch Q1. Therefore, the voltage signal VG at the control terminal of the load switch Q1 is at the high voltage level. The parasitic charge stored in the load switch Q1 is released, and the load switch Q1 is rapidly turned off. Since the load switch Q1 is turned off, the potential difference VSD between the first terminal and the second terminal of the load switch Q1 is at the Thigh voltage level, and the conducting current ID of the load switch Q1 is 0. At this time, the filtering unit 120 maintains the output voltage Vout.

As the duty cycle of the control signal SC increases, the voltage value of the output voltage Vout also increases. At the time T2, the duty cycle of the control signal SC reaches 100%, the voltage value of the output voltage Vout may be close or equal to the input voltage Vin, and the soft-start operation finishes.

It should be noted that, when the load switch Q1 is rapidly turned on or turned off, the conducting current signal ID (curve C2) of the load switch Q1 and the potential difference VSD (curve C1) between the first terminal and the second terminal of the load switch Q1 are not occurred at the same time. The power value of the dissipated power P of the load switch Q1 is substantially 0. Therefore, the consumed power P of the load switch Q1 occurs only at the transition from turn-on to turn-off and verse vice, also in short time duration. Consequently, the consumed power P of the load switch Q1 is very low. And, the load switch Q1 does not generate high thermos-electrical stress during the soft-start operation.

Figure 4:
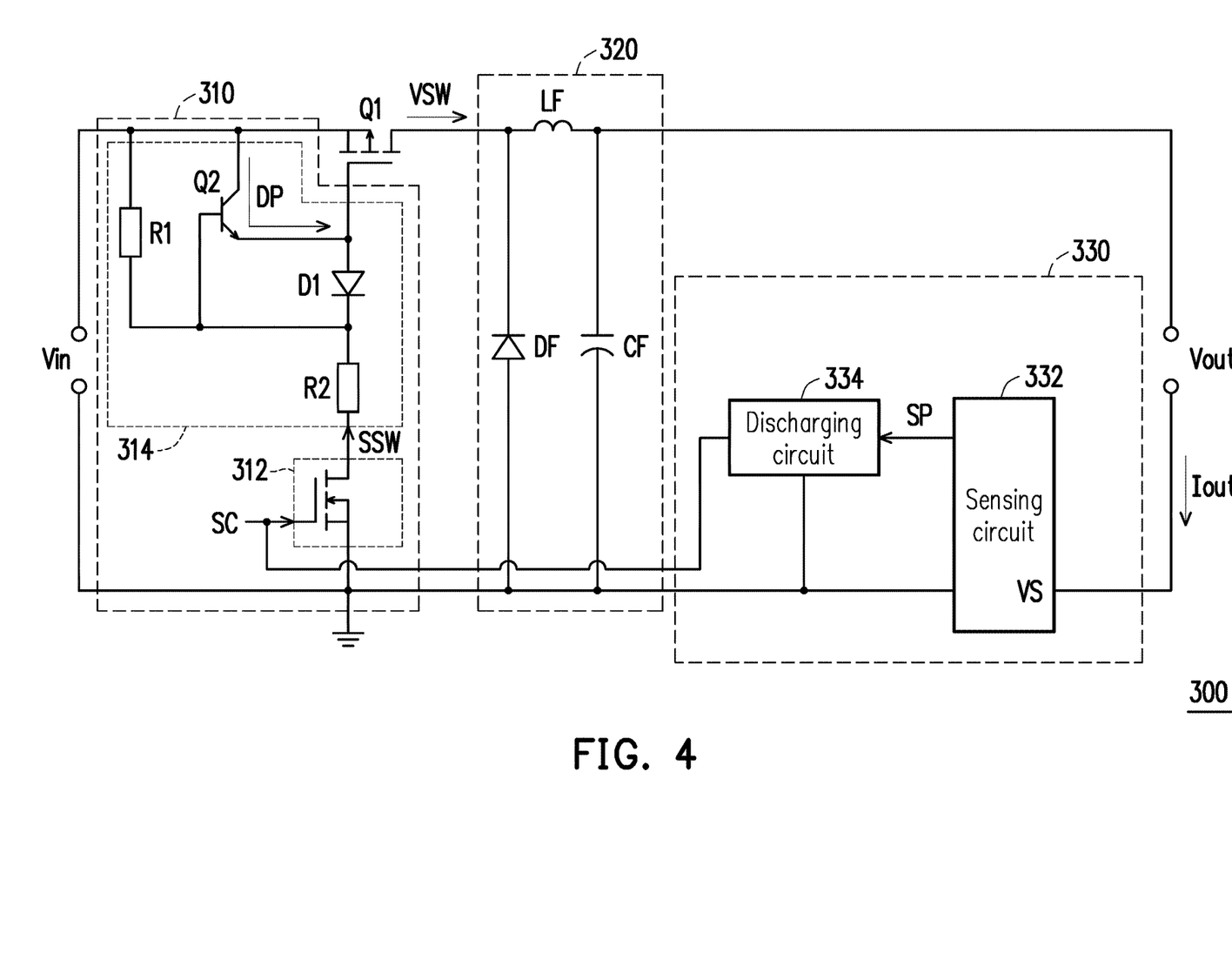
FIG. 4 is a schematic diagram illustrating a soft-start control circuit in accordance with a third embodiment of the invention.

Referring to FIG. 4, FIG. 4 is a schematic diagram illustrating a soft-start control circuit in accordance with a third embodiment of the invention. In the embodiment, a soft-start control circuit 300 includes a load switch Q1, a driving unit 310, and a filtering unit 320 and a protecting circuit 330. An operating of the load switch Q1, the driving unit 310, and the filtering unit 320 can be obtained at least from the embodiment in FIGS. 1, 2 and 3, and therefore is not repeated herein. In the embodiment, the protecting circuit 330 is coupled to the driving switch 312. The protecting circuit 330 pulls down a voltage level of the control signal SC according to an output current Iout. The output voltage Vout produces the output current Iout when receiving the output voltage Vout from the filtering unit 320. The protecting circuit 330 may receive the output current Iout and detect whether a current value of the output current Iout has an overcurrent phenomenon. The protecting circuit 330 may pull-down the voltage level of the control signal SC to disable the load switch Q1 when the overcurrent phenomenon occurred.

In the embodiment, protecting circuit 330 includes a sensing circuit 332 and a discharging circuit 334. The sensing circuit 332 converts the output current Iout into a sensing voltage VS. The sensing circuit 332 provides a protecting signal SP when a voltage value of the sensing voltage VS is higher than a default voltage value. On the other hand, the sensing circuit 332 does not provide the protecting signal SP when the voltage value of the sensing voltage VS is less than or equal to the default voltage value. The discharging circuit 334 is coupled to the sensing circuit 332 and the control terminal of the driving switch 312. The discharging circuit 334 pulls down the voltage level of the control signal SC when receiving the protecting signal SP from the sensing circuit 332.

Figure 5:
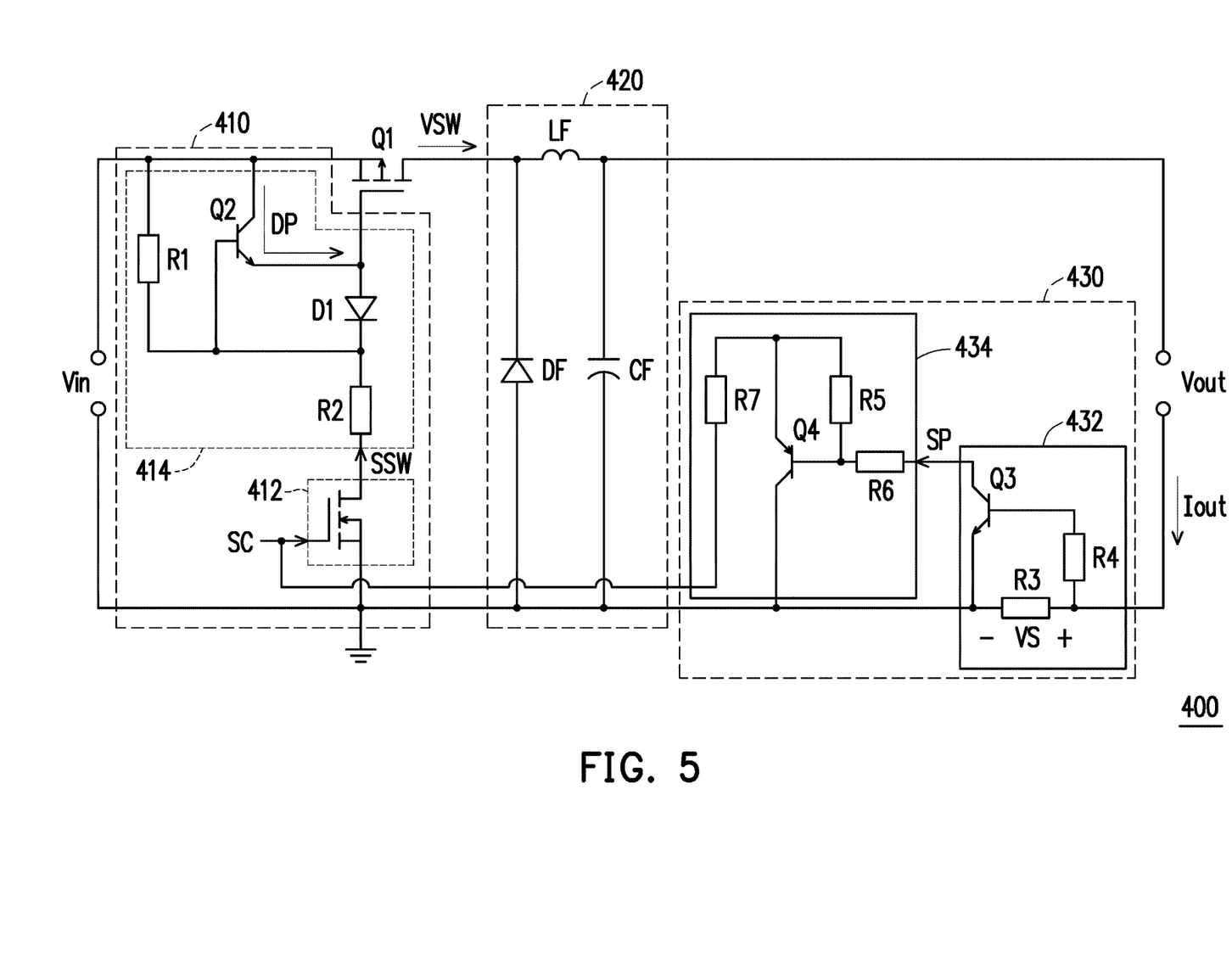
FIG. 5 is a schematic diagram illustrating a soft-start control circuit in accordance with a fourth embodiment of the invention.

More specifically, referring to FIG. 5, FIG. 5 is a schematic diagram illustrating a soft-start control circuit in accordance with a third embodiment of the invention. In the embodiment, a soft-start control circuit 400 includes a load switch Q1, a driving unit 410, and a filtering unit 420 and a protecting circuit 430. An operating of the load switch Q1, the driving unit 410, and the filtering unit 420 can be obtained at least from the embodiment in FIGS. 1, 2 and 3, and therefore is not repeated herein. The sensing circuit 432 includes a sensing resistor R3 and a first switch Q3. The sensing resistor R3 has a first terminal and a second terminal. The first terminal of the sensing resistor R3 is used to receive the output current Iout, the second terminal of the sensing resistor R3 is coupled to the reference low potential. The sensing resistor R3 provides the sensing voltage VS based on an interaction of a resistance value of the sensing resistor R3 and the output current Iout. In other words, the sensing voltage VS is roughly equal to a product of the output current Iout and the resistance value of the sensing resistor R3.

In the embodiment, the first switch Q3 has a first terminal, a second terminal and a control terminal. The first terminal of the first switch Q3 is coupled to the discharging circuit 434. The protecting signal SP is output through the first terminal of the first switch Q3. The second terminal of the first switch Q3 is coupled to the second terminal of the sensing resistor R3. The control terminal of the first switch Q3 is electrically coupled to the first terminal of the sensing resistor R3. In the embodiment, the first switch Q3 is realized as an NPN bipolar transistor. In other embodiment, the first switch Q3 may be realized as an N-type field-effect transistor. In the embodiment, the default voltage value may be related to a threshold voltage value (e.g. 0.6 V) of the first switch Q3. When the voltage value of the sensing voltage VS is higher than the default voltage value, the first switch Q3 is turned-on. Therefore, the first switch Q3 provides the protecting signal SP having a low voltage level.

In the embodiment, the sensing circuit 432 further includes a limiting resistor R4. The limiting resistor R4 is coupled between the first terminal of the sensing resistor R3 and the control terminal of the first switch Q3. The limiting resistor R4 may limit a current flowing into the control terminal of the first switch Q3. Therefore, the limiting resistor R4 may protect the control terminal of the first switch Q3 from a high current damage from the output current Iout.

In the embodiment, the discharging circuit 434 includes a second switch Q4 and a resistor R5. The second switch Q4 has a first terminal, a second terminal and a control terminal. The first terminal of the second switch Q4 is electrically coupled to the control terminal of the driving switch 412. The second terminal of the second switch Q4 is coupled to the reference low potential. The control terminal of the second switch Q4 is electrically coupled to the first terminal of the first switch Q3. In the embodiment, the second switch Q4 is realized as a PNP bipolar transistor. In other embodiment, the second switch Q4 may be realized as a P-type field-effect transistor. In the embodiment, the second switch Q4 is turned on according to the protecting signal SP having a low voltage level and provides a discharge path for the control signal SC.

In the embodiment, the resistor R5 is coupled between the first terminal of the second switch Q4 and the control terminal of the second switch Q4. When the control terminal of the driving switch 412 receives the control signal SC, the resistor R5 may provide a signal following the duty cycle of the control signal SC to the control terminal of the second switch Q4. Therefore, when the voltage value of the control signal SC is high and the first switch Q3 is turned off, the second switch Q4 does not operate an incorrect operation such as turned on.

In the embodiment, the control terminal of the driving switch 412 receives the control signal SC, the second switch Q4 is turned off. The output voltage Vout produces the output current Iout when receiving the output voltage Vout. When the overcurrent phenomenon occurred, the voltage value of the sensing voltage VS is higher than the default voltage value. Therefore, the first switch Q3 is turned on and provides the protecting signal SP having the low voltage level. The second switch Q4 is turned on to discharge the control signal SC based on the low voltage level of the protecting signal SP. The driving switch 412 and load switch Q1 are both turned off. Therefore, the output voltage Vout is not provided.

In the embodiment, the discharging circuit 434 further includes limiting resistors R6 and R7. The limiting resistor R6 is coupled between the first terminal of the first switch Q3 and the control terminal of the second switch Q4. The limiting resistor R6 may limit a current flowing into the control terminal of the second switch Q4 when the first switch Q3 is turned on. Therefore, the limiting resistor R6 protects the second switch Q4 from a high current damage when the first switch Q3 is turned on. The limiting resistor R7 is coupled between the first terminal of the second switch Q4 and the control terminal of the driving switch 412. The limiting resistor R7 may limit a current flowing into an external device providing the control signal SC. Therefore, the limiting resistor R7 protects the external device providing the control signal SC from a high current damage when the second switch Q4 is turned on.

In view of the foregoing, during the time when the soft-start operation is performed, the soft-start control circuit according to the embodiments of the invention releases the parasitic charge stored in the load switch through the discharging circuit when the load switch is turned off. The load switch is capable of rapidly switching between on and off during the time when the soft-start operation is performed, thereby reducing the power consumption of the load switch at the time of performing the soft-start operation. In this way, the load switch does not generate high thermos-electrical stress during the time when the soft-start operation is performed, thereby preventing the load switch failure. In addition, since the load switch according to the embodiments of the invention does not generate a high thermos-electrical stress, lower power rating load switch can be used compared with the conventional soft-start load switch design.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A soft-start control circuit, comprising:
a load switch, having a first terminal, a second terminal, and a control terminal, wherein the first terminal of the load switch is configured to receive an input voltage, the control terminal of the load switch is configured to receive a switching signal and perform switching between on and off according to the switching signal, thereby performing the soft-start operation, and the second terminal of the load switch is configured to provide a switched voltage;
a driving unit, coupled to the first terminal of the load switch and the control terminal of the load switch, wherein the driving unit comprises:
a driving switch, configured to provide the switching signal according to a control signal; and a first discharging circuit, coupled to the load switch and the driving switch, and configured to release a parasitic charge stored in the load switch when the load switch is turned off;

a filtering unit, coupled to the second terminal of the load switch and configured to convert the switched voltage into an output voltage and output the output voltage; and a protecting circuit, coupled to the driving switch, configured to pull-down a voltage level of the control signal according to an output current.

2. The soft-start control circuit as claimed in claim 1, wherein the first discharging circuit provides a discharging path connected between the first terminal of the load switch and the control terminal of the load switch when the load switch is turned off, so as to release the parasitic charge stored between the first terminal of the load switch and the control terminal of the load switch.

3. The soft-start control circuit as claimed in claim 1, wherein the first discharging circuit comprises:

a bipolar transistor, having a collector, an emitter, and a base, wherein the collector is coupled to the first terminal of the load switch, and the emitter is coupled to the control terminal of the load switch, wherein when the load switch is turned off, the bipolar transistor is turned on to form a discharging path between the first terminal of the load switch and the control terminal of the load switch.

4. The soft-start control circuit as claimed in claim 3, wherein the first discharging circuit further comprises:

a first resistor, having a first terminal and a second terminal, wherein the first terminal of the first resistor is coupled to the collector, and the second terminal of the first resistor is coupled to the base; and a second resistor, having a first terminal and a second terminal, wherein the first terminal of the second resistor is coupled to the base and the second terminal of the first resistor, and the second terminal of the second resistor is coupled to the driving switch.

5. The soft-start control circuit as claimed in claim 4, wherein the driving switch has a first terminal, a second terminal, and a control terminal, the first terminal of the driving switch is coupled to the control terminal of the load switch through the second resistor, the second terminal of the driving switch is coupled to a reference low potential, and the control terminal of the driving switch is configured to receive the control signal, wherein when the driving switch is turned on, the load switch is turned on.

6. The soft-start control circuit as claimed in claim 5, wherein the protecting circuit comprises:

a sensing circuit, configured to convert the output current into a sensing voltage and provide a protecting signal when a voltage value of the sensing voltage is higher than a default voltage value; and a second discharging circuit, coupled to the sensing circuit and the control terminal of the driving switch, configured to pull-down the voltage level of the control signal according to the protecting signal.

7. The soft-start control circuit as claimed in claim 6, wherein the sensing circuit comprises:

a sensing resistor, having a first terminal and a second terminal, wherein the first terminal of the sensing resistor is configured to receive the output current, the second terminal of the sensing resistor is coupled to the reference low potential, and the sensing resistor is configured to provide the sensing voltage based on a resistance value of the sensing resistor; and a first switch, having a first terminal, a second terminal and a control terminal, wherein the first terminal of the first switch is coupled to the second discharging circuit, the second terminal of the first switch is coupled to the second terminal of the sensing resistor, and the control terminal of the first switch is electrically coupled to the first terminal of the sensing resistor.

8. The soft-start control circuit as claimed in claim 7, wherein the first switch is realized as an N-type field-effect transistor or NPN bipolar transistor, wherein the protecting signal is output through the first terminal of the first switch, and wherein the protecting signal have a low voltage level.

9. The soft-start control circuit as claimed in claim 7, wherein the second discharging circuit comprises:

a second switch; having a first terminal, a second terminal and a control terminal, wherein the first terminal of the second switch is electrically coupled to the control terminal of the driving switch, the second terminal of the second switch is coupled to the reference low potential, and the control terminal of the second switch is electrically coupled to the first terminal of the first switch; and a third resistor, coupled between the first terminal of the second switch and the control terminal of the second switch.

10. The soft-start control circuit as claimed in claim 9, wherein the second switch is realized as a P-type field-effect transistor or PNP bipolar transistor, wherein the second switch provides a discharge path for the control signal according to the protecting signal having a low voltage level.

11. The soft-start control circuit as claimed in claim 9, wherein the sensing circuit further comprises:

a first limiting resistor, coupled between the first terminal of the sensing resistor and the control terminal of the first switch, configured to limit a current flowing into the control terminal of the first switch.

12. The soft-start control circuit as claimed in claim 11, wherein the second discharging circuit comprises:

a second limiting resistor, coupled between the first terminal of the first switch and the control terminal of the second switch; and a third limiting resistor, coupled between the first terminal of the second switch and the control terminal of the driving switch.

13. The soft-start control circuit as claimed in claim 4, wherein when the driving switch is turned off, the base receives the parasitic charge through the first resistor, and a forward bias is generated between the base and the emitter, so as to turn on the bipolar transistor, thereby forming the discharging path.

14. The soft-start control circuit as claimed in claim 3, wherein the first discharging circuit further comprises:

a diode, having an anode and a cathode, wherein the anode of the diode is coupled to the emitter and the control terminal of the load switch, and the cathode of the diode is coupled to the base, wherein the diode is configured to generate a reverse bias between the base and the emitter when the load switch is turned on, thereby preventing the discharging path from being formed when the load switch is turned on.

15. The soft-start control circuit as claimed in claim 1, wherein the load switch is realized as a P-type field-effect transistor.

16. The soft-start control circuit as claimed in claim 1, wherein the driving switch is realized as an N-type field-effect transistor or NPN bipolar transistor.

17. The soft-start control circuit as claimed in claim 1, wherein the filtering unit comprises:
- a filtering inductor, having a first terminal and a second terminal, wherein the first terminal of the filtering inductor is coupled to the second end of the load switch to receive the switched voltage, and the second end of the filtering inductor is configured to provide the output voltage;
- a filtering capacitor, coupled between the second terminal of the filtering inductor and a reference low potential; and
- a filtering diode, having an anode and a cathode, wherein the cathode of the filtering diode is coupled to the first terminal of the filtering inductor, and the anode of the filtering diode is coupled to the reference low potential.

* * * * *